(12) United States Patent
Jin et al.

(10) Patent No.: US 12,349,504 B2
(45) Date of Patent: Jul. 1, 2025

(54) SOLAR CELL AND PHOTOVOLTAIC MODULE

(71) Applicants: ZHEJIANG JINKO SOLAR CO., LTD., Zhejiang (CN); JINKO SOLAR CO., LTD., Jiangxi (CN)

(72) Inventors: Jingsheng Jin, Zhejiang (CN); Linan Zhang, Zhejiang (CN)

(73) Assignees: ZHEJIANG JINKO SOLAR CO., LTD., Haining (CN); JINKO SOLAR CO., LTD., Jiangxi (CN)

( * ) Notice: Subject to any disclaimer, the term of this patent is extended or adjusted under 35 U.S.C. 154(b) by 275 days.

(21) Appl. No.: 18/124,177

(22) Filed: Mar. 21, 2023

(65) Prior Publication Data

US 2024/0194799 A1    Jun. 13, 2024

(30) Foreign Application Priority Data

Nov. 30, 2022 (CN) .......................... 202211543886.5

(51) Int. Cl.
  H10F 77/00    (2025.01)
  H10F 10/174   (2025.01)
  (Continued)

(52) U.S. Cl.
  CPC ......... H10F 77/311 (2025.01); H10F 10/174 (2025.01); H10F 19/906 (2025.01);
  (Continued)

(58) Field of Classification Search
  CPC ...... H10F 19/80; H10F 77/311; H10F 77/164; H10F 77/211
  See application file for complete search history.

(56) References Cited

U.S. PATENT DOCUMENTS

2008/0041434 A1* 2/2008 Adriani .................. H02S 40/36
                                                          136/244
2016/0155866 A1* 6/2016 Ha ....................... H10F 77/1645
                                                          136/255
(Continued)

FOREIGN PATENT DOCUMENTS

CN    108963005 A    12/2018
CN    212750903 U     3/2021

OTHER PUBLICATIONS

Extended European Search Report issued in corresponding EP Application 23163103.7, issued Aug. 31, 2023, 9 pages.
(Continued)

*Primary Examiner* — Lindsey A Buck
(74) *Attorney, Agent, or Firm* — Burris Law, PLLC

(57) ABSTRACT

A solar cell and a photovoltaic module. The solar cell includes substrate, tunnel oxide layer, doped conductive layer, intrinsic polycrystalline silicon layer, enhanced conductive portion, and first electrodes. The tunnel oxide layer covers the first surface of the substrate. The doped conductive layer covers one side of the tunnel oxide layer away from the substrate. The intrinsic polycrystalline silicon layer is formed on one side of the doped conductive layer away from the tunnel oxide layer. The enhanced conductive portion covers one side of the intrinsic polycrystalline silicon layer away from the doped conductive layer, and is at least partially connected to the doped conductive layer. First electrodes are formed on one side of the enhanced conductive portion away from the intrinsic polycrystalline silicon layer, and at least part of each first electrode is located in the enhanced conductive portion to be electrically connected to the doped conductive layer.

17 Claims, 2 Drawing Sheets

(51) Int. Cl.
*H10F 19/80* (2025.01)
*H10F 19/90* (2025.01)
*H10F 77/122* (2025.01)
*H10F 77/164* (2025.01)
*H10F 77/20* (2025.01)
*H10F 77/30* (2025.01)

(52) U.S. Cl.
CPC ......... *H10F 77/122* (2025.01); *H10F 77/164* (2025.01); *H10F 77/211* (2025.01); *H10F 19/80* (2025.01); *H10F 77/935* (2025.01)

(56) References Cited

U.S. PATENT DOCUMENTS

2019/0172957 A1* 6/2019 Anker .................. H10F 71/121
2022/0140160 A1 5/2022 Jin et al.

OTHER PUBLICATIONS

Yu et al., Recent Advances in and New Perspectives on Crystalline Silicon Solar Cells with Carrier-Selective Passivation Contacts, Crystals, 2018, vol. 8, 430, 18 pages, MDPI, Switzerland.

Ghosh, et al., Fundamentals, present status and future perspective of TOPCon solar cells: A comprehensive review, Surfaces and Interfaces, pp. 1-38, vol. 30 (2022) 101917, Elsevier B.V.

Haase et al., Cells and modules with passivating contacts—POLO technology, Webinar presentation, PERC and beyond—next generation modules, what can we expect?, May 9, 2019, 13 pages, ISFH, Germany.

* cited by examiner

SOLAR CELL AND PHOTOVOLTAIC MODULE

CROSS-REFERENCE TO RELATED APPLICATIONS

This application claims priority to and the benefit of Chinese Patent Application No. 202211543886.5, filed on Nov. 30, 2022, the content of which is incorporated herein by reference in its entirety.

FIELD

The present disclosure relates to the technical field of solar cells and, in particular, to a solar cell and a photovoltaic module.

BACKGROUND

The statements in this section merely provide background information related to the present disclosure and may not constitute prior art.

Solar cells can directly convert solar radiation energy into electrical energy. A tunnel oxide layer and a doped conductive layer may generally be manufactured on a surface of a substrate to enhance the passivation effect on the substrate. In the related art, an electrical connection between electrodes and the doped conductive layer of the solar cell is not reliable enough, and transport of carriers between the electrodes and the doped conductive layer is not efficient, which adversely affects photoelectric conversion efficiency of the solar cell.

SUMMARY

This section provides a general summary of the disclosure and is not a comprehensive disclosure of its full scope or all of its features.

The present disclosure provides a solar cell and a photovoltaic module, which can improve the photoelectric conversion efficiency of the solar cell.

In a first aspect of the present disclosure, a solar cell is provided, the solar cell includes: a substrate including a first surface; a tunnel oxide layer covering the first surface; a doped conductive layer covering one side of the tunnel oxide layer away from the substrate; an intrinsic polycrystalline silicon layer formed on one side of the doped conductive layer away from the tunnel oxide layer; an enhanced conductive portion covering one side of the intrinsic polycrystalline silicon layer away from the doped conductive layer, wherein at least part of the enhanced conductive portion is connected to the doped conductive layer; and first electrodes formed on one side of the enhanced conductive portion away from the intrinsic polycrystalline silicon layer, wherein at least part of each of the first electrodes is located in the enhanced conductive portion to be electrically connected to the doped conductive layer through the enhanced conductive portion.

In one or more embodiments, the enhanced conductive portion includes an enhanced conductive film and an enhanced conductive pillar connected to each other, and the enhanced conductive film covers the side of the intrinsic polycrystalline silicon layer away from the doped conductive layer. Along a thickness direction of the solar cell, two ends of the enhanced conductive pillar are connected to the doped conductive layer and the enhanced conductive film, respectively.

In one or more embodiments, a conductivity of the enhanced conductive film and a conductivity of the enhanced conductive pillar are both greater than a conductivity of the doped conductive layer.

In one or more embodiments, a thickness D1 of the enhanced conductive film satisfies: $1\ nm \leq D1 \leq 40\ nm$.

In one or more embodiments, the enhanced conductive film is made of one or more of a metal conductive material, a semiconductor material, an inorganic composite conductive material, or a polymer dielectric.

In one or more embodiments, the enhanced conductive pillar is made of one or more of a metal conductive material, a semiconductor material, an inorganic composite conductive material, or a polymer dielectric.

In one or more embodiments, the intrinsic polycrystalline silicon layer covers an entire surface on the side of the doped conductive layer away from the tunnel oxide layer.

In one or more embodiments, the enhanced conductive pillar is formed in the intrinsic polycrystalline silicon layer; and the enhanced conductive pillar passes through the intrinsic polycrystalline silicon layer and is connected to the doped conductive layer and the enhanced conductive film.

In one or more embodiments, the doped conductive layer and the enhanced conductive film have doping elements of a same conductivity type, and the enhanced conductive film has a doping concentration greater than the doped conductive layer. The doping element in the enhanced conductive film permeates toward the doped conductive layer to form the enhanced conductive pillar.

In one or more embodiments, the doping element in the doped conductive layer has a concentration range from $1 \times 10^{18}$ atoms/cm$^3$ to $5 \times 10^{21}$ atoms/cm$^3$.

In one or more embodiments, the doping element in the enhanced conductive film has a concentration range from $5 \times 10^{18}$ atoms/cm$^3$ to $1 \times 10^{22}$ atoms/cm$^3$.

In one or more embodiments, the intrinsic polycrystalline silicon layer includes a plurality of covering portions configured to cover one side of the doped conductive layer away from the tunnel oxide layer. The covering portions cover parts of the doped conductive layer corresponding to the first electrodes.

In one or more embodiments, the enhanced conductive pillar is located between two adjacent covering portions and in contact with side surfaces of the covering portions.

In one or more embodiments, the solar cell further includes a local doped region connected to the first electrode, the intrinsic polycrystalline silicon layer, and the doped conductive layer, respectively, so that the first electrode is electrically connected to the doped conductive layer.

In one or more embodiments, the solar cell further includes a first passivation layer covering one side of the enhanced conductive film away from the intrinsic polycrystalline silicon layer.

In one or more embodiments, the substrate further has a second surface opposite to the first surface. The solar cell further includes: an emitter formed at the second surface; second electrodes formed on one side of the emitter away from the substrate and electrically connected to the emitter; and a second passivation layer covering one side of the emitter away from the substrate.

In a second aspect of the present disclosure, a photovoltaic module is provided, the photovoltaic module includes: at least one solar cell string formed by connecting a plurality of solar cells as described above; at least one packaging layer configured to cover a surface of the solar cell string; and at least one cover plate configured to cover a surface of the packaging layer away from the solar cell string.

It should be understood that the general description above and the detailed description in the following are merely exemplary and cannot limit the present disclosure.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figure 1:
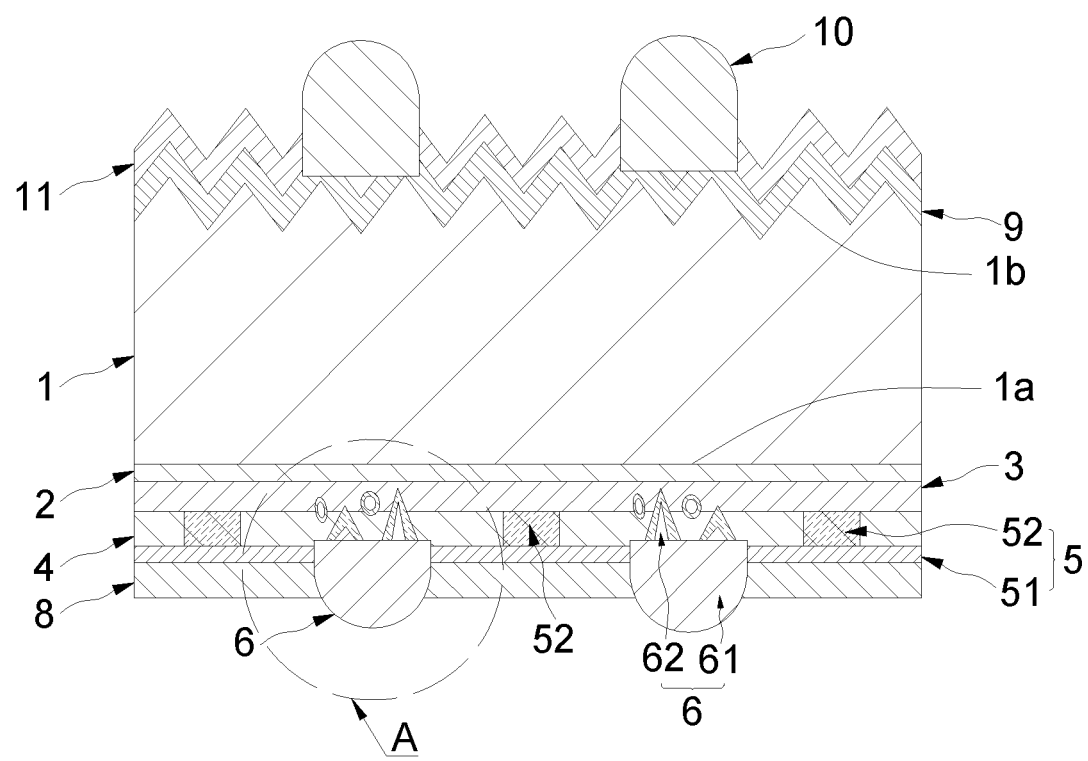
FIG. 1 is a schematic diagram of a sectional structure of a solar cell according to one or more embodiments of the present disclosure.

The accompanying drawings herein, which are incorporated in and constitute a part of this specification, illustrate embodiments consistent with the present disclosure and, together with the specification, serve to explain principles of the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

In order to better understand the technical solution of the present disclosure, embodiments of the present disclosure are described in detail below with reference to the accompanying drawings.

It should be made clear that the embodiments described are only some rather than all of the embodiments of the present disclosure. All other embodiments acquired by those of ordinary skill in the art without creative efforts based on the embodiments in the present disclosure fall within the protection scope of the present disclosure.

The terms used in the embodiments of the present disclosure are intended solely to describe particular embodiments and are not intended to limit the present disclosure. As used in the specification of the present disclosure and the appended claims, the singular forms of "a/an", "the", and "said" are intended to include plural forms, unless otherwise clearly specified in the context.

It should be understood that the term "and/or" used herein only describes an association relationship between associated objects and represents that three relationships may exist. For example, A and/or B may represent the following three cases: only A exists, both A and B exist, and only B exists. In addition, the character "/" herein generally means that associated objects before and after it are in an "or" relationship.

It is to be noted that positional terms such as "above" or "below", "left", and "right" described in the embodiments of the present disclosure are described from the perspective shown in the drawings and should not be construed as limiting the embodiments of the present disclosure. In addition, in the context, it should be further understood that, when an element is referred to as "above" or "below" another element, it can be directly connected "above" or "below" another element, and can also be indirectly connected "above" or "below" another element through an intermediate element.

In the related art, when a solar cell is manufactured, a tunnel oxide layer and a doped conductive layer may be formed on one side of a substrate. The tunnel oxide layer can be used as a tunnel layer for majority carriers, and chemical passivation is performed on the surface of the substrate at the same time to reduce interface states. The doped conductive layer may form energy band bending, which realizes selective transport of carriers, reduces recombination loss, and thus ensure transport efficiency of the carriers. In addition, a metal electrode may also be manufactured on the surface of the substrate. The metal electrode is electrically connected to the doped conductive layer, and does not penetrate the tunnel oxide layer to maintain good interface passivation effect. The doped conductive layer has a light absorption capability, which may cause certain optical loss and reduce front cell efficiency and back cell efficiency of the solar cell, thereby reducing the double-sided rate of the solar cell, resulting in reduced double-sided power generation rate when the solar cell is used for double-sided power generation.

When the doped conductive layer is thinned, the light absorption capability of the doped conductive layer can be reduced, thereby reducing the optical loss and improving the cell efficiency of the solar cell. However, after the doped conductive layer is thinned, the metal electrode can easily penetrate the tunnel oxide layer and contact the substrate, resulting in destruction of the passivation effect on the surface of the substrate, increasing carrier recombinations on the surface of the substrate, and leading to a decrease in photoelectric conversion efficiency of the solar cell.

In an existing solar cell, the configuration of "the metal electrode is in contact with the doped conductive layer, but does not penetrate the tunnel oxide layer" may be achieved by adding an intrinsic polycrystalline silicon layer on one side of the doped conductive layer away from the substrate. However, the intrinsic polycrystalline silicon layer has the problem of poor conductivity, which may lead to unsmooth transport of carriers between the doped conductive layer and the metal electrode, affecting the efficiency of the solar cell.

Based on the above related art, some embodiments of the present disclosure provide a solar cell. The solar cell can improve the photoelectric conversion efficiency of the solar cell. As shown in FIG. 1, the solar cell includes a substrate 1, a tunnel oxide layer 2, a doped conductive layer 3, an intrinsic polycrystalline silicon layer 4, an enhanced conductive portion 5, and a first electrode 6. The substrate 1 has a first surface 1a. The tunnel oxide layer 2 covers the first surface 1a. The doped conductive layer 3 covers one side of the tunnel oxide layer away from the substrate 1. The intrinsic polycrystalline silicon layer 4 is arranged on one side of the doped conductive layer 3 away from the tunnel oxide layer 2. The enhanced conductive portion 5 covers one side of the intrinsic polycrystalline silicon layer 4 away from the doped conductive layer 3, and at least part of the enhanced conductive portion 5 is connected to the doped conductive layer 3. Multiple first electrodes 6 are arranged on one side of the enhanced conductive portion 5 away from the intrinsic polycrystalline silicon layer 4, and at least part of each of the plurality of first electrodes 6 is located in the enhanced conductive portion 5 to be electrically connected to the doped conductive layer 3 through the enhanced conductive portion 5.

The substrate 1 is configured to receive incident light and generate photo-generated carriers, the tunnel oxide layer 2 can perform chemical passivation on the first surface 1a and can reduce density of interface defects of the first surface 1a, thereby reducing recombination centers of the first surface 1a to reduce a carrier recombination rate, and the doped conductive layer 3 is configured to form a field passivation layer, which can reduce concentration of minority carriers, thereby reducing the carrier recombination rate. The intrinsic polycrystalline silicon layer 4 is arranged on the side of the doped conductive layer 3 away from the tunnel oxide layer 2, which can increase a distance between the first electrode 6 and the tunnel oxide layer 2, prevent contact of the first electrode 6 with the substrate 1 due to penetration through the tunnel oxide layer 2, and prevent damages to the tunnel oxide layer 2, so that good interface passivation effect can be maintained at the first surface 1a, preventing an increase in carrier recombinations, thereby improving the photoelectric conversion efficiency of the solar cell. Moreover, the intrinsic polycrystalline silicon layer 4 is not doped, and has a light absorption coefficient much lower than the doped conductive layer 3. Therefore, the arrangement of the intrinsic polycrystalline silicon layer 4 can also reduce optical loss of the solar cell and improve utilization of light energy by the solar cell.

The intrinsic polycrystalline silicon layer 4 does not include any doping elements, and the intrinsic polycrystalline silicon layer 4 has lower conductivity than the doped conductive layer 3. When the intrinsic polycrystalline silicon layer 4 is located on a surface of the doped conductive layer 3, it is not conducive to achieve an electrical connection between the first electrode 6 and the doped conductive layer 3, leading to a decrease in the carrier transport rate. Therefore, there is a need to provide the enhanced conductive portion 5 with stronger conductivity to realize the electrical connection between the first electrode 6 and the doped conductive layer 3.

In some embodiments, as shown in FIG. 1, the enhanced conductive portion 5 covers one side of the intrinsic polycrystalline silicon layer 4 away from the doped conductive layer 3, at least part of the enhanced conductive portion 5 is connected to the doped conductive layer 3, and at least part of each of the first electrodes 6 is located in the enhanced conductive portion 5, which can realize the electrical connection between the doped conductive layer 3 and the first electrode 6, so that carriers can be transported between the doped conductive layer 3 and the first electrode 6 directly through the enhanced conductive portion 5. As a result, the carriers' transport capability can be enhanced and serial resistance of the solar cell can be reduced, thereby improving photoelectric conversion efficiency of the solar cell, increasing both front cell and back cell efficiency, and increasing double-sided rate of the solar cell.

In one or more embodiments, the substrate 1 may be a silicon substrate, including, but not limited to, a monocrystalline silicon substrate, a polycrystalline silicon substrate, a microcrystalline silicon substrate, a nanocrystalline silicon substrate, and the like.

In some embodiments, as shown in FIG. 1, the enhanced conductive portion 5 includes an enhanced conductive film 51 and an enhanced conductive pillar 52 connected to each other. The enhanced conductive film 51 covers the side of the intrinsic polycrystalline silicon layer 4 away from the doped conductive layer 3. Along a thickness direction of the solar cell, two ends of the enhanced conductive pillar 52 are connected to the doped conductive layer 3 and the enhanced conductive film 51, respectively.

The enhanced conductive portion 5 includes the enhanced conductive film 51 and the enhanced conductive pillar 52 connected to each other, and the enhanced conductive pillar 52 is configured to electrically connect the doped conductive layer 3 with the enhanced conductive film 51, so that carriers in the doped conductive layer 3 can flow to the enhanced conductive film 51 through the enhanced conductive pillar 52 and then flow to the first electrode 6 through the enhanced conductive film 51, thereby realizing the electrical connection between the doped conductive layer 3 and the first electrode 6.

When the enhanced conductive portion 5 is divided into the enhanced conductive film 51 and the enhanced conductive pillar 52, it is conducive to reducing process difficulty of the solar cell, and the two can be designed and manufactured separately, which facilitates manufacturing of the solar cell.

In some embodiments, conductivity of the enhanced conductive film 51 and conductivity of the enhanced conductive pillar 52 are both greater than conductivity of the doped conductive layer 3.

When the conductivity of the enhanced conductive film 51 and the conductivity of the enhanced conductive pillar 52 are greater than the conductivity of the doped conductive layer 3, the enhanced conductive portion 5 as an entirety has good conductive properties, which can reduce resistance of the carriers transported between the doped conductive layer 3 and the first electrode 6 and improve current transport efficiency, thereby improving the photoelectric conversion efficiency of the solar cell.

The conductivity of the enhanced conductive film 51 is greater than the enhanced conductive pillar 52.

Figure 3:
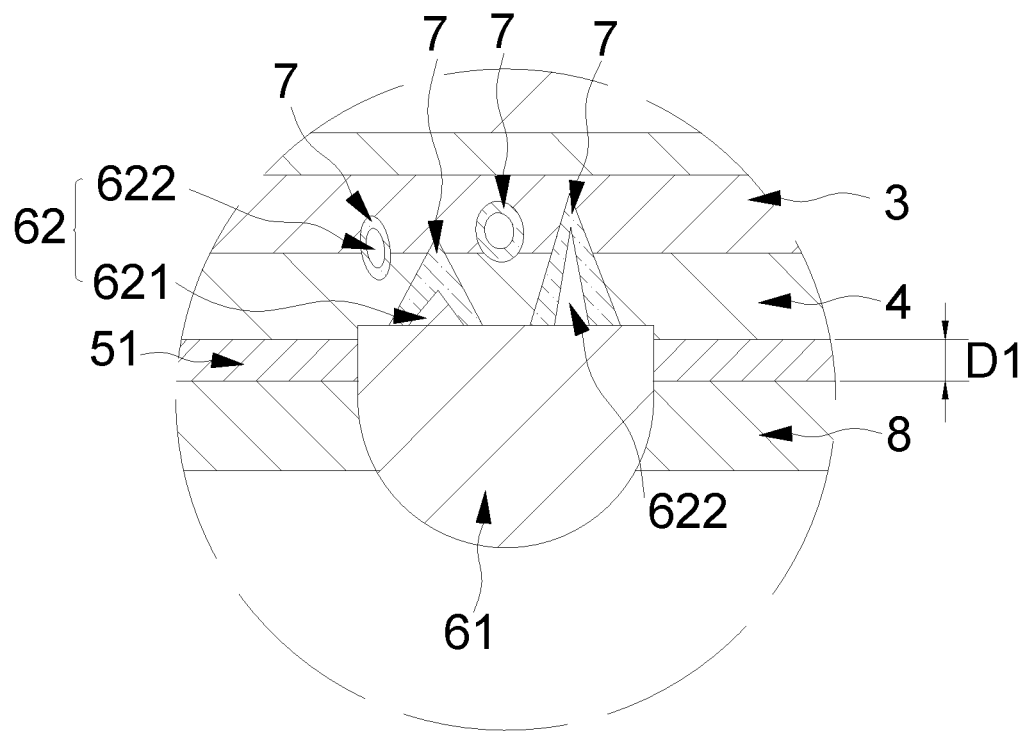
FIG. 3 is an enlarged view of Part A in FIG. 1.

In some embodiments, as shown in FIG. 3, a thickness D1 of the enhanced conductive film 51 satisfies: $1\ nm \leq D1 \leq 40\ nm$. For example, the thickness may be 1 nm, 5 nm, 10 nm, 20 nm, or 40 nm, or other values in the above range, which is not limited herein.

The thickness D1 of the enhanced conductive film 51 should not be excessively large or excessively small. If D1 is excessively large (e.g., greater than 40 nm), absorption and utilization of light quanta by the substrate 1 may be affected, thereby affecting the photoelectric conversion efficiency of the solar cell. If D1 is excessively small (e.g., less than 1 nm), reliability of the electrical connection between the doped conductive layer 3 and the first electrode 6 may be lowered and the resistance value is larger. Therefore, when the thickness D1 of the enhanced conductive film 51 ranges from 1 nm to 40 nm, the electrical connection between the doped conductive layer 3 and the first electrode 6 is more reliable and the resistance value is smaller while more light photon reach the substrate 1.

In some embodiments, the enhanced conductive film 51 is made of one or more of a metal conductive material, a semiconductor material, an inorganic composite conductive material, and a polymer dielectric.

The metal conductive material may be gold (Au), platinum (Pt), palladium (Pd), or the like. The semiconductor material may be polycrystalline silicon, microcrystalline silicon, indium tin oxide (ITO), transparent conductive oxide (TCO), or the like. The inorganic composite conductive material may be a $Bi_2O_3/Au/Bi_2O_3$ composite material, a TiO$_2$/Ag/TiO$_2$ composite material, or the like. The polymer dielectric may be polyaniline, polypyrrole, or the like.

The above materials have excellent conductive properties and high light transmittance, can enhance transport capability of the carriers between the doped conductive layer 3 and the first electrode 6, and reduce the serial resistance of the solar cell, without causing greater optical loss to the solar cell.

The enhanced conductive pillar 52 may be made of a same material as or a different material from the enhanced conductive film 51. In some embodiments, the enhanced conductive pillar 52 is made of one or more of a metal conductive material, a semiconductor material, an inorganic composite conductive material, or a polymer dielectric.

The metal conductive material may be Au, Pt, Pd, or the like. The semiconductor material may be polycrystalline silicon, microcrystalline silicon, ITO, TCO, or the like. The inorganic composite conductive material may be a Bi$_2$O$_3$/Au/Bi$_2$O$_3$ composite material, a TiO$_2$/Ag/TiO$_2$ composite material, or the like. The polymer dielectric may be polyaniline, polypyrrole, or the like.

The above materials have excellent conductive properties and high light transmittance, can enhance transport capability of the carriers between the doped conductive layer 3 and the first electrode 6, and reduce the serial resistance of the solar cell, without causing greater optical loss to the solar cell.

In some embodiments, as shown in FIG. 1, the intrinsic polycrystalline silicon layer 4 covers an entire surface on the side of the doped conductive layer 3 away from the tunnel oxide layer 2.

The intrinsic polycrystalline silicon layer 4 completely covers the side of the doped conductive layer 3 away from the tunnel oxide layer 2, which can increase the distance between the first electrode 6 and the tunnel oxide layer 2. In the process of sintering electrode paste to form the first electrode 6, a top end of the first electrode 6 may first contact the intrinsic polycrystalline silicon layer 4 and then contact the doped conductive layer 3, which reduces the possibility that the first electrode 6 penetrates the tunnel oxide layer 2 and contacts the substrate 1.

In some embodiments, as shown in FIG. 1, the enhanced conductive pillar 52 is formed in the intrinsic polycrystalline silicon layer 4, and the enhanced conductive pillar 52 passes through the intrinsic polycrystalline silicon layer 4 to be connected to the doped conductive layer 3 and the enhanced conductive film 51.

The enhanced conductive pillar 52 is formed in the intrinsic polycrystalline silicon layer 4 and passes through the intrinsic polycrystalline silicon layer 4, which can achieve an effect of being connected to the doped conductive layer 3 and the enhanced conductive film 51 respectively. The intrinsic polycrystalline silicon layer 4 has relatively poor conductivity, and the doped conductive layer 3 and the enhanced conductive film 51 are separated by the intrinsic polycrystalline silicon layer 4, so resistance therebetween is relatively large, which affects the efficiency of the solar cell. Therefore, there is a need to form the enhanced conductive pillar 52 to realize the connection between the doped conductive layer 3 and the enhanced conductive film 51, so that the carriers can flow to the first electrode 6 from the doped conductive layer 3 through the enhanced conductive pillar 52 and the enhanced conductive film 51, thereby achieving the purpose of improving the carriers' transport capability.

In some embodiments, the doped conductive layer 3 and the enhanced conductive film 51 have doping elements of a same conductivity type, and doping concentration of the enhanced conductive film 51 is greater than the doped conductive layer 3. The doping element in the enhanced conductive film 51 permeates toward the doped conductive layer 3 to form the enhanced conductive pillar 52.

When the enhanced conductive film 51 and the doped conductive layer 3 have the doping elements of the same conductivity type and the doping concentration of the enhanced conductive film 51 is greater than the doped conductive layer 3, the doping elements can permeate along a direction of from high concentration to low concentration, so as to form the enhanced conductive pillar 52 between the doped conductive layer 3 and the enhanced conductive film 51, which improves conductivity between the doped conductive layer 3 and the first electrode 6 and enhances the carriers' transport capability, thereby reducing the serial resistance of the solar cell.

In some embodiments, concentration of the doping element in the doped conductive layer 3 ranges from $1 \times 10^{18}$ atoms/cm$^3$ to $5 \times 10^{21}$ atoms/cm$^3$. Concentration of the doping element in the enhanced conductive film 51 ranges from $5 \times 10^{18}$ atoms/cm$^3$ to $1 \times 10^{22}$ atoms/cm$^3$.

In some embodiments, the concentration of the doping element in the doped conductive layer 3 may be $1 \times 10^{18}$ atoms/cm$^3$, $5 \times 10^{18}$ atoms/cm$^3$, $1 \times 10^{19}$ atoms/cm$^3$, $1 \times 10^{20}$ atoms/cm$^3$, or $5 \times 10^{21}$ atoms/cm$^3$, or other values in the above range, which is not limited herein.

In some embodiments, the concentration of the doping element in the enhanced conductive film 51 may be $5 \times 10^{18}$ atoms/cm$^3$, $1 \times 10^{19}$ atoms/cm$^3$, $1 \times 10^{20}$ atoms/cm$^3$, $5 \times 10^{21}$ atoms/cm$^3$, or $1 \times 10^{22}$ atoms/cm$^3$, or other values in the above range, which is not limited herein.

When the concentration of the doping element in the doped conductive layer 3 and the concentration of the doping element in the enhanced conductive film 51 satisfy the above ranges respectively, the enhanced conductive pillar 52 can be formed by permeation, and concentration of a doping element in the enhanced conductive pillar 52 is the same as the enhanced conductive film 51, which ensures that the transport capability of the carriers of the solar cell is improved, thereby improving performance of the solar cell.

Figure 2:
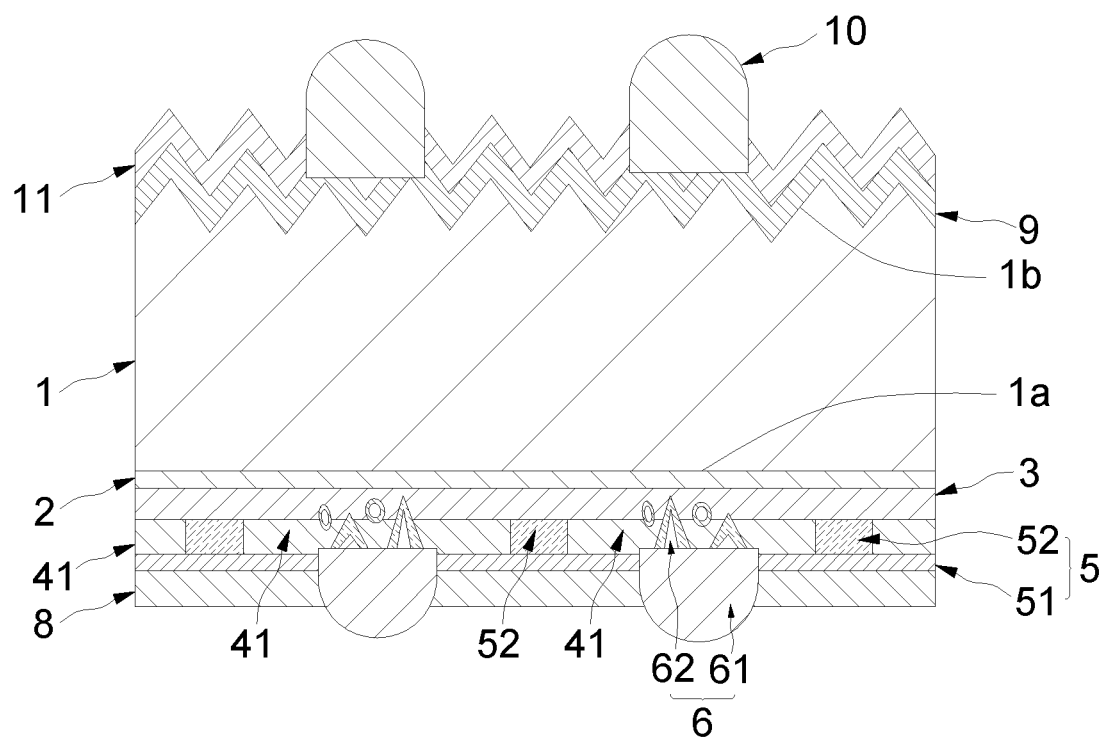
FIG. 2 is a schematic diagram of the sectional structure of a solar cell according to one or more embodiments of the present disclosure.

In addition, in some other embodiments, as shown in FIG. 2, the intrinsic polycrystalline silicon layer 4 includes a plurality of covering portions 41. The covering portions 41 are each configured to cover one side of the doped conductive layer 3 away from the tunnel oxide layer 2. The covering portions 41 cover parts of the doped conductive layer 3 corresponding to the first electrodes 6, respectively.

In one or more embodiments, the intrinsic polycrystalline silicon layer 4 is formed by multiple covering portions 41 spaced apart from one another. Each of the covering portions 41 covers part of a surface of the doped conductive layer 3 and can correspond to one of the plurality of first electrodes 6 to ensure that the first electrode 6 can first contact the covering portion 41 and then contact the doped conductive layer 3, which reduces the possibility that the first electrode 6 penetrates the tunnel oxide layer 2 and contacts the substrate 1. On this basis, the covering portions 41 spaced apart are beneficial to reduce the optical loss of the solar cell, so that more light is absorbed by the substrate 1, and more carriers are generated, thereby improving the photoelectric conversion efficiency of the solar cell. Costs for the arrangement of the intrinsic polycrystalline silicon layer 4 can also be reduced, thereby reducing manufacturing costs of the solar cell.

In some embodiments, as shown in FIG. 2, the enhanced conductive pillar 52 is located between two adjacent covering portions 41 and in contact with side surfaces of the covering portions 41.

The enhanced conductive pillar 52 is located between two adjacent covering portions 41, which effectively utilizes an internal space of the solar cell. The enhanced conductive pillar 52 is in contact with side surfaces of the covering portions 41, which enables the carriers to be transported between the adjacent covering portions 41 through the enhanced conductive pillar 52 and reduces the resistance of the solar cell, thereby improving the photoelectric conversion efficiency of the solar cell.

In some embodiments, as shown in FIG. 1, the solar cell further includes a local doped region 7. The local doped region 7 is connected to the first electrode 6, the intrinsic polycrystalline silicon layer 4, and the doped conductive layer 3, respectively, so that the first electrode 6 is electrically connected to the doped conductive layer 3.

The local doped region 7 has relatively strong conductivity, which can improve the transport capability of the carriers between the first electrode 6 and the doped conductive layer 3. As shown in FIG. 3, the local doped region 7 is located in regions of the intrinsic polycrystalline silicon layer 4 and the doped conductive layer 3. When the first electrode 6 does not penetrate the intrinsic polycrystalline silicon layer 4, the local doped region 7 can be connected to the first electrode 6, the intrinsic polycrystalline silicon layer 4, and the doped conductive layer 3 respectively, so as to realize the electrical connection between the first electrode 6 and the doped conductive layer 3 and accelerate the carrier transport rate. When the first electrode 6 penetrates the intrinsic polycrystalline silicon layer 4 and contacts the doped conductive layer 3 to form the electrical connection, the local doped region 7 can improve conduction efficiency between the first electrode 6 and the doped conductive layer 3, thereby increasing the carrier transport rate. Therefore, the local doped region 7 cooperates with the enhanced conductive portion 5 to improve the cell efficiency of the solar cell.

In some embodiments, the first electrode 6 is a metal electrode, the first electrode 6 and the doped conductive layer 3 have doping elements of a same conductivity type, and doping concentration of the first electrode 6 is greater than the doped conductive layer 3. In the process of high-temperature sintering the electrode paste, the doping element in the first electrode 6 permeates toward the doped conductive layer 3 to form the local doped region 7.

For example, the doping element may be an N-type dopant including Group V elements such as phosphorus (P), arsenic (As), bismuth (Bi), and antimony (Sb), or a P-type dopant including Group III elements such as boron (B), aluminum (Al), gallium (Ga), and indium (In). The first electrode 6 and the substrate 1 may have the doping elements of a same conductivity type or the doping elements of different conductivity types.

In addition, the first electrode 6 is sintered from metal electrode paste. A doping element in the metal electrode paste accounts for 0.01% to 5% of all components of the paste, and may be 0.01%, 0.05%, 1%, 3%, or 5%, or other values in the above range, which is not limited herein.

After the local doped region 7 is formed, a ratio of the doping concentration of the doping element in the local doped region 7 to the doping concentration of the doping element in the doped conductive layer 3 ranges from 1:100 to 1:1, and may be 1:100, 1:80, 1:50, 1:30, or 1:1, or other values in the above range, which is not limited herein.

In some embodiments, as shown in FIG. 3, the first electrode 6 includes a body 61 and an extension 62 extending along the body 61 toward the doped conductive layer 3. The body 61 is provided on the side of the intrinsic polycrystalline silicon layer 4 away from the doped conductive layer 3. The body 61 is not in direct contact with the doped conductive layer 3, which can reduce damages to the field passivation layer and ensure that the first surface 1a has a good passivation effect. The extension 62 is electrically connected to the body 61, both of which can play a role of transporting the carriers. The extension 62 extends along the body 61 toward the doped conductive layer 3, and the extension 62 is formed due to permeation of the electrode paste toward the doped conductive layer 3 during the sintering of the electrode paste. The intrinsic polycrystalline silicon layer 4 can prevent penetration of the extension 62 through the tunnel oxide layer 2. The local doped region 7 covers a surface of the extension 62 not in contact with the body 61, and can be connected to the intrinsic polycrystalline silicon layer 4 and the doped conductive layer 3, to realize an electrical connection between the extension 62 and the doped conductive layer 3.

The extension 62 includes a first part 621 and a second part 622, the first part 621 is connected to the body 61, a gap is formed between the second part 622 and each of the body 61 and the first part 621, one part of the local doped region 7 covers the first part 621, and the other part of the local doped region 7 covers the second part 622.

The extension 62 may be embodied as the first part 621 directly connected to the body 61 or alternatively embodied as the second part 622 spaced from the body 61. The second part 622 is a crystal grain in a free state, and surfaces of the first part 621 and the second part 622 are covered with the local doped region 7 to ensure a stable electrical connection between the extension 62 and the doped conductive layer 3.

In some embodiments, the solar cell further includes a first passivation layer 8, and the first passivation layer 8 covers one side of the enhanced conductive film 51 away from the intrinsic polycrystalline silicon layer 4.

The first passivation layer 8 may perform passivation on the surface in contact with it, and is configured to enhance the passivation effect of the solar cell, which can reduce recombinations of carriers at the interface and improve transport efficiency of the carriers, thereby improving the photoelectric conversion efficiency of the solar cell. The first passivation layer 8 also has a function of reducing or eliminating reflected light on a surface of the solar cell and increasing a light transmission amount, which further improves the photoelectric conversion efficiency of the solar cell.

In some embodiments, the first passivation layer 8 may include components such as silicon oxide, silicon nitride, aluminum oxide, or silicon oxynitride. In addition, the first passivation layer 8 may have a single-layer structure or a multi-layer structure, and a refractive index and a thickness of each layer may be designed accordingly.

In some embodiments, as shown in FIG. 1, the substrate 1 further has a second surface 1b arranged opposite to the first surface 1a, and the solar cell further includes an emitter 9, a second electrode 10, and a second passivation layer 11. The emitter 9 is arranged at the second surface 1b. For example, the emitter 9 may be formed on the second surface 1b, or may be formed partially inside or completely within the second surface 1b, depending on different requirements and designs. A plurality of second electrodes 10 are arranged on one side of the emitter 9 away from the substrate 1, and the plurality of second electrodes 10 are electrically connected to the emitter 9. The second passivation layer 11 covers one side of the emitter 9 away from the substrate 1.

Both the first surface 1a and the second surface 1b of the substrate 1 may be configured to receive incident light or reflected light. As shown in FIG. 1, the second surface 1b opposite to the first surface 1a is sequentially provided with the emitter 9, the second electrode 10, and the second passivation layer 11. When the substrate 1 is a P-type silicon substrate, the emitter 9 may be an N-type emitter, and the two may jointly form a PN junction structure. In some embodiments, when the substrate 1 is an N-type silicon substrate, the emitter 9 may be a P-type emitter. The function and effect of the second passivation layer 11 are close to the first passivation layer 8, which performs passivation on the surface in contact therewith, thereby reducing recombinations of carriers at the interface, improving transport efficiency of the carriers, and thus improving the photoelectric conversion efficiency of the solar cell.

In addition, as shown in FIG. 1, the second surface 1b of the substrate 1 may be arranged as a pyramid textured structure, so that reflectivity of the second surface 1b to incident light is reduced, and an absorption utilization rate of light is increased, thereby increasing the light transmission amount of the second surface 1b, and thus improving the photoelectric conversion efficiency of the solar cell. The first surface 1a of the substrate 1 may be arranged as a non-pyramid textured structure, such as laminated stair profile, so that the tunnel oxide layer 2 on the first surface 1a has higher density and uniformity, enabling the tunnel oxide Layer 2 to have good passivation effect on the substrate 1. In some embodiments, the first surface 1a may be a rear surface of the substrate 1, that is, one side of the substrate 1 facing away from the sun. Correspondingly, the second surface 1b may be a front surface of the substrate 1, that is, one side of the substrate 1 facing the sun and configured to receive sunlight. In some embodiments, the first surface 1a may also be the front surface of the substrate 1, and correspondingly, the second surface 1b may also be the rear surface of the substrate 1.

Figure 4:
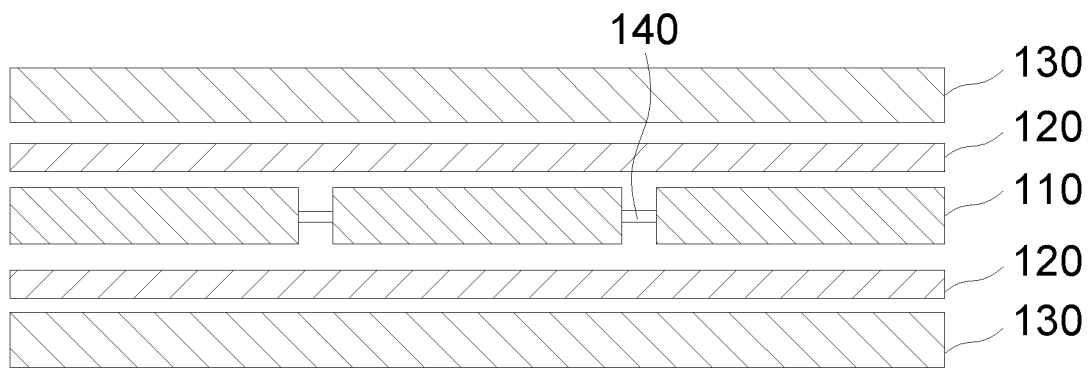
FIG. 4 is a schematic structural diagram of a photovoltaic module according to one or more embodiments of the present disclosure.

Some embodiments of the present disclosure provide a photovoltaic module. As shown in FIG. 4, the photovoltaic module includes at least one solar cell string 110, at least one packaging layer 120, and at least one cover plate 130. The solar cell string 110 is formed by connecting a plurality of solar cells. The solar cells each are the solar cell described in the above embodiments. The packaging layer 120 is configured to cover a surface of the solar cell string 110. The cover plate 130 is configured to cover a surface of the packaging layer 120 away from the solar cell string 110.

As shown in FIG. 4, the solar cells are electrically connected in the form of a whole piece or a plurality of cuts to form a plurality of solar cell strings 110, and the plurality of solar cell strings 110 are electrically connected in series and/or in parallel. In some embodiments, the plurality of solar cell strings 110 may be electrically connected through conductive strips 140. The packaging layer 120 covers a front surface and a rear surface of the solar cell. In some embodiments, the packaging layer 120 may be an organic packaging adhesive film such as an ethylene vinyl acetate copolymer (EVA) adhesive film, a polyethylene octene co-elastomer (POE) adhesive film, a polyethylene terephthalate (PET) adhesive film, or polyvinyl butyral (PVB). The cover plate 130 may be a cover plate 130 with a light-transmitting function such as a glass cover plate or a plastic cover plate. In some embodiments, a surface of the cover plate 130 facing the packaging layer 120 may be a concave-convex surface, thereby increasing the utilization rate of the incident light.

The solar cell is provided with the enhanced conductive portion 5, which can improve the transport capability of the carriers between the doped conductive layer 3 and the first electrode 6 and reduce the serial resistance of the solar cell, thereby improving the photoelectric conversion efficiency of the solar cell, and photoelectric conversion efficiency of the photovoltaic module including the solar cell can also be improved.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, material, manufacturing, and assembly tolerances, and testing capability.

As used herein, the phrase at least one of A, B, and C should be construed to mean a logical (A OR B OR C), using a non-exclusive logical OR, and should not be construed to mean "at least one of A, at least one of B, and at least one of C."

The above are merely preferred embodiments of the present disclosure and are not intended to limit the present disclosure. For those skilled in the art, the present disclosure may be subject to various changes and variations. Any modification, equivalent replacement, improvement, and the like made within the spirit and principles of the present disclosure shall fall within the protection scope of the present disclosure.

What is claimed is:

1. A solar cell comprising:
a substrate including a first surface;
a tunnel oxide layer covering the first surface;
a doped conductive layer covering one side of the tunnel oxide layer away from the substrate;
an intrinsic polycrystalline silicon layer formed on one side of the doped conductive layer away from the tunnel oxide layer;
an enhanced conductive portion covering one side of the intrinsic polycrystalline silicon layer away from the doped conductive layer, wherein at least part of the enhanced conductive portion is connected to the doped conductive layer, and a conductivity of the enhanced conductive portion is greater than a conductivity of the doped conductive layer; and
a first electrode formed on one side of the enhanced conductive portion away from the intrinsic polycrystalline silicon layer, wherein at least part of the first electrode is located in the enhanced conductive portion to be electrically connected to the doped conductive layer through the enhanced conductive portion;
wherein the enhanced conductive portion includes an enhanced conductive film and an enhanced conductive pillar connected to each other, and the enhanced conductive film covers the side of the intrinsic polycrystalline silicon layer away from the doped conductive layer; and along a thickness direction of the solar cell, two ends of the enhanced conductive pillar are connected to the doped conductive layer and the enhanced conductive film, respectively; and
wherein the intrinsic polycrystalline silicon layer includes a plurality of covering portions configured to cover one side of the doped conductive layer away from the tunnel oxide layer; and the covering portions cover part of the doped conductive layer corresponding to the first electrode.

2. The solar cell according to claim 1, wherein the conductivity of the enhanced conductive film and a conductivity of the enhanced conductive pillar are both greater than the conductivity of the doped conductive layer.

3. The solar cell according to claim 1, wherein a thickness D1 of the enhanced conductive film satisfies: $1\text{ nm} \leq D1 \leq 40\text{ nm}$.

4. The solar cell according to claim 1, wherein the enhanced conductive film is made of one or more of a metal conductive material, a semiconductor material, an inorganic composite conductive material, polyaniline or polypyrrole.

5. The solar cell according to claim 1, wherein the enhanced conductive pillar is made of one or more of a metal conductive material, a semiconductor material, an inorganic composite conductive material, polyaniline or polypyrrole.

6. The solar cell according to claim 1, wherein the enhanced conductive pillar is formed in the intrinsic polycrystalline silicon layer; and
the enhanced conductive pillar passes through the intrinsic polycrystalline silicon layer and is connected to the doped conductive layer and the enhanced conductive film.

7. The solar cell according to claim 6, wherein the doped conductive layer and the enhanced conductive film have a doping element of a same conductivity type, and the enhanced conductive film has a doping concentration greater than the doped conductive layer; and
the doping element in the enhanced conductive film permeates toward the doped conductive layer to form the enhanced conductive pillar.

8. The solar cell according to claim 7, wherein the doping element in the doped conductive layer has a concentration range from $1 \times 10^{18}$ atoms/cm$^3$ to $5 \times 10^{21}$ atoms/cm$^3$.

9. The solar cell according to claim 7, wherein the doping element in the enhanced conductive film has a concentration range from $5 \times 10^{18}$ atoms/cm$^3$ to $1 \times 10^{22}$ atoms/cm$^3$.

10. The solar cell according to claim 1, wherein the enhanced conductive pillar is located between two adjacent covering portions and in contact with side surfaces of the covering portions.

11. The solar cell according to claim 1, further comprising a local doped region connected to the first electrode, the intrinsic polycrystalline silicon layer, and the doped conductive layer, respectively, so that the first electrode is electrically connected to the doped conductive layer.

12. The solar cell according to claim 11, wherein the first electrode and the doped conductive layer have doping elements of a same conductivity type, and the first electrode has a doping concentration greater than the doped conductive layer, and
wherein the local doped region has the same doping elements as the first electrode.

13. The solar cell according to claim 12, wherein a ratio of the doping concentration of the doping elements in the local doped region to the doping concentration of the doping element in the doped conductive layer ranges from 1:100 to 1:1.

14. The solar cell according to claim 1, wherein a proportion of a doping element in a metal electrode paste used for the first electrode ranges from 0.01% to 5%.

15. The solar cell according to claim 1, further comprising a first passivation layer covering one side of the enhanced conductive film away from the intrinsic polycrystalline silicon layer.

16. The solar cell according to claim 1, wherein the substrate further includes a second surface opposite to the first surface; and
the solar cell further comprises:
an emitter formed at the second surface;
second electrodes formed on one side of the emitter away from the substrate and electrically connected to the emitter; and
a second passivation layer covering one side of the emitter away from the substrate.

17. A photovoltaic module, wherein the photovoltaic module comprises:
a solar cell string formed by connecting a plurality of solar cells;
a packaging layer configured to cover a surface of the solar cell string; and
a cover plate configured to cover a surface of the packaging layer away from the solar cell string,
wherein at least one of the plurality of solar cells includes:
a substrate including a first surface;
a tunnel oxide layer covering the first surface;
a doped conductive layer covering one side of the tunnel oxide layer away from the substrate;
an intrinsic polycrystalline silicon layer formed on one side of the doped conductive layer away from the tunnel oxide layer;
an enhanced conductive portion covering one side of the intrinsic polycrystalline silicon layer away from the doped conductive layer, wherein at least part of the enhanced conductive portion is connected to the doped conductive layer, and a conductivity of the enhanced conductive portion is greater than a conductivity of the doped conductive layer; and
a first electrode formed on one side of the enhanced conductive portion away from the intrinsic polycrystalline silicon layer, wherein at least part of the first electrode is located in the enhanced conductive portion to be electrically connected to the doped conductive layer through the enhanced conductive portion;
wherein the enhanced conductive portion includes an enhanced conductive film and an enhanced conductive pillar connected to each other, and the enhanced conductive film covers the side of the intrinsic polycrystalline silicon layer away from the doped conductive layer; and along a thickness direction of the solar cell, two ends of the enhanced conductive pillar are connected to the doped conductive layer and the enhanced conductive film, respectively; and
wherein the intrinsic polycrystalline silicon layer includes a plurality of covering portions configured to cover one side of the doped conductive layer away from the tunnel oxide layer; and the covering portions cover part of the doped conductive layer corresponding to the first electrode.

* * * * *